United States Patent [19]
Chapron

[11] 4,011,469
[45] Mar. 8, 1977

[54] HALL EFFECT-SWITCHING DEVICE
[75] Inventor: Claude Chapron, Caen, France
[73] Assignee: U.S. Philips Corporation, New York, N.Y.
[22] Filed: Jan. 12, 1976
[21] Appl. No.: 648,397

Related U.S. Application Data
[63] Continuation of Ser. No. 485,227, July 2, 1974, abandoned.

[30] Foreign Application Priority Data
July 9, 1973 France .............................. 73.25035

[52] U.S. Cl. ............................... 307/278; 307/290; 307/303; 307/309; 357/27
[51] Int. Cl.² .................. H01L 43/06; H03K 17/90
[58] Field of Search .......... 307/290, 303, 309, 278; 357/27

[56] References Cited
UNITED STATES PATENTS
3,449,517   6/1969   Turja .............................. 307/278 X
3,596,114   7/1971   Maupin ............................. 307/278

Primary Examiner—John S. Heyman
Attorney, Agent, or Firm—Frank R. Trifari; Ronald L. Drumheller

[57] ABSTRACT

In an integrated semiconductor Hall-effect switching device, the Hall element is effectively prebiased by unequal base-emitter junction internal voltage drops resulting from unequal base-emitter areas in the transistors connected to the Hall element.

4 Claims, 5 Drawing Figures

HALL EFFECT-SWITCHING DEVICE

This is a continuation of application Ser. No. 485,227, filed July 2, 1974, now abandoned.

The present invention relates to a semiconductor device having a switch comprising a Hall element and a differential switching unit which shows at least two stable states and which comprises an input stage having two transistors the base zones of which, which are of the same conductivity type, are coupled to the Hall element so that the unit can be controlled by means of a magnetic field which may have at least two different values and by which a Hall voltage is produced in the Hall element.

Switching devices are known which use the Hall effect and in which a relative displacement between two positions of a magnetic mass in the field of which a Hall cell is present causes the change of the state of a system, for example, a bistable device. These switching devices are manufactured by forming in a semiconductor body at least a part of the elements of the system which is controlled by the potential difference (hereinafter referred to as Hall voltage) which is caused by the Hall effect in the cell and sometimes also said cell itself. The bistable system which is controlled by the transition from one value to the other of the magnetic field usually comprises a first differential stage, for example, a symmetrical differential amplifier or a bistable trigger of differential structure of the Schmidt trigger type.

The input members of such a differential stage are mainly formed by two equal transistors the base zones of which are electrically connected to the output terminals of the Hall cells and the emitters of which are usually interconnected and to a common point which is often coupled to a current source. In the case of a symmetrical circuit, the voltage derived from the collectors of the transistors may be supplied by a bistable detection stage having threshold effect. In the case of an asymmetric circuit with feedback coupling between the collector of a transistor and the base of the other, (which circuit may have the characteristics of a bistable trigger) the signal derived from the collector of the second transistor may be amplified by means of an arbitrary amplifier stage.

FIG. 1 of the accompanying drawings shows a diagram with curve 1 which shows the theoretical characteristic of the Hall voltage $V_H$ which can be derived from the output of a Hall element and possibly be amplified and which may form the input voltage of the bistable system having threshold effect, as a function of the magnetic field H to which the cell is subjected. In the industrial manufacture a certain spread of the characteristic is noticed, for example, between the limits shown by the lines 2 and 3, in which a zero voltage $V_H = 0$ can correspond to a whole series of values of the field between $H_C$ and $H_D$. This spread is due to various factors, such as the geometry of the cell, the inhomogeneity of the material, the arrangement of the contact terminals and possibly the natural spreading of the components of an amplifier stage. On the other hand, a bistable system having threshold effect usually shows a hysteresis phenomenon in the sense that, for example, the threshold of the variation of state is larger with increasing voltage than the threshold of the variation of state with decreasing voltage. The system generally also shows a spreading of the components of the trigger stage. The state of the system is not exactly known for a given series of input voltages, for example, between $V_A$ and $V_B$. These values $V_A$ and $V_B$ correspond respectively to possible values of the magnetic field between $H_A$ and $H_B$. The uncertainties about the values of the magnetic field to which the cell is actually subjected should be taken into account. Stray fields or residual fields may join the field and may cause this to seem larger or smaller than it actually is.

Summarizing it may be said that, taking into account all these spreadings, the state of the bistable system is known exactly only for magnetic fields having values lying beyond the interval $H_A - H_B$. When the variations in the state of the bistable system should correspond accurately to the transition from one value to the other which can be taken by the magnetic field, a shift of the characteristic $V_H = f(H)$ of the Hall cell can advantageously be effected, possibly associated with an amplifier stage, so that both values which the magnetic field can assume correspond to values of the voltage which are on either side of and at a comparatively large distance from the voltage series within which the possibility exists of the variation of state of the bistable system. In the case of the device of which FIG. 1 shows the characteristic, the curve will have to be moved, for example, over a distance $\Delta H$.

A known method of obtaining such a shift is known inter alia from the U.S. Pat. No. 3,596,114. This method consists of the use of a bias voltage at the differential stage which is present at the output of a Hall cell and which is obtained by a movement of the contact terminals from which the Hall voltage is derived. However, said movement of the contact terminals represents a very small distance in the case of integrated circuits and an accurate manufacture is difficult. The adjustment of such a movement is difficult because the inevitable spreadings in any industrial manufacture and also the strong dependence of the impedances of the Hall cell and the characteristic of the arrangement of the system which receives the Hall voltage should be taken into account, due to said dependence, thermal fluctuations may rapidly disturb the responses of the device.

It is the object of the present invention to avoid the said drawbacks.

Another object of the invention is to realize a precise, easy and reproducible movement of the output voltages of a system which has differential structure and is connected to the terminals of a Hall cell.

Still another object of the invention is to realize an integratable circuit having at least one stage with differential structure which receives the voltage supplied by a Hall cell and by means of which two different states can be obtained for two values of the magnetic field to which the cell is subjected in a bistable system, taking into account the spreadings of the characteristic of the cell, of the characteristic of the system having differential structure and of the values of the magnetic field.

The invention endeavours to provide the equivalent of a shift of the reference potential of the voltage derived from the terminals of the Hall effect cell to create, for example, a certain shift from the equilibrium state in a differential amplifier stage in the absence of the magnetic field.

According to the invention, a device of the type described in the preamble is characterized in that, in order to obtain a preferential state in the differential switching unit, the surfaces of the base emitter junctions in the transistors are different so that the range of voltages to be supplied to the input stage at which a transition occurs in the switching unit from one state to the other is present between the input voltages which are supplied by the Hall element and which correspond to the two said values of the magnetic field.

The ratio between the surfaces of the emitter base junctions of the two transistors which are otherwise the same determines a difference between the internal voltage drops across said junctions. It is actually known that the internal voltage drop $V_e$ of an emitter base junction of a transistor may be estimated for a current I by using the equation $V_e = (kT/q) \log (I/I_s)$, where $k$ is Boltzmann's constant, $T$ the absolute temperature, $q$ the charge of the electron and $I_s$ the saturation current of the emitter base diode.

With the same current I, two transistors which are the same in any point except as regard the surfaces of the emitter-base junction, will show voltage drops across the emitter-base junctions which differ from $|\Delta V| = |(kT/q) \log (I_2/I_1)|$, where $I_2$ and $I_1$ are the saturation currents of the respective emitter-base diodes.

These saturation currents are proportional to the surface of said junctions; hence $|\Delta V| = |(kT/q) \log (S_2/S_1)|$ is obtained, where $S_2$ and $S_1$ are the respective surfaces of the emitter-base junctions of the two transistors which serve as input members of the bistable system.

Since the emitters are connected to a common point, a certain shift of the voltages supplied by the stage which is formed by the two transistors results from said given difference between the voltage drops. In the case in which the transistors are mounted as a differential amplifier stage, the latter shows a certain shift from the equilibrium state in the absence of the magnetic field to which the cell is to be subjected. In the case in which the transistors are mounted as a bistable trigger, the flipping threshold are shifted over a given value. With a correct choice of the ratio between the surfaces of the emitter-base junctions of the two transistors, the values of the voltages which correspond to the changes in state of the bistable system are sufficiently shifted to be present between the voltage values corresponding to the two values which can be achieved by the magnetic field.

In particular in the case of a bistable system of which the thresholds are usually around the value $V = 0$ and the state of which would not be exactly known for a magnetic field the intensity of which is near zero, the uncertainty range of the thresholds is shifted relative to the uncertainty range of the fields by the difference between the surfaces of the emitter-base junctions of the two transistors. In that case the ratio between said surfaces may differ relatively much from 1. This case presents itself when the device is to detect the presence or absence of a magnetic field.

The invention uses a difference in emitter-base surface which can readily be realized without specific difficulties according to the prior art. A simple local modification of a diffusion mask may contribute, for example, to the effect in view. A considerable difference in the surface may correspond to a very small voltage difference and it is easy to obtain the desired shift by a simple local change of a diffusion mask. This change has no adverse influence on the other components of the system; for example, the amplification is not varied.

The adjustment of the thresholds of the variation in state relative to the possible values of the magnetic field according to the invention does not result in any modification of the manufacturing steps of the devices. In the case in which the device is manufactured according to the integrated circuit technology, a window of a diffusion mask must be varied locally.

The two transistors which serve as input members of the bistable system are preferably transistors of the planar type and they are integrated in the same monocrystalline semiconductor body.

The Hall element is advantageously integrated in the same semiconductor plate as the said transistors the emitter base junctions of which have different surfaces and the collectors and bases of which are the same. Thus the drawbacks of connections with large length are avoided and a device having a small volume is obtained which can be manufactured with the usual methods of manufacturing integrated circuits.

According to another preferred embodiment of the invention resistors which form a differential amplifier in cooperation with the above-defined transistors are also integrated in the same mono-crystalline plate as the said transistors; for example, two substantially equal resistors which each connect one of the two collectors of the transistors to a contact means of a voltage source and a third transistor which connects the assembly of the two emitters of the transistors to another contact means of a current source. Advantageously, the same energy source serves as a current source for supplying the Hall cell and for biasing the transistors. So a compact assembly is obtained with the advantages of the integrated circuits involved which can be manufactured with the same integrated circuit technology.

According to another embodiment of the invention, resistors which form a stage of a Schmidt trigger in cooperation with the two above-mentioned transistors are also integrated in the same monocrystalline plate as that of the said transistors a resistor connects the assembly of the two emitters to a contact means of an external voltage source and a resistor connects the collector of a transistor to another contact means of an external voltage source, the base of the same transistor being connected to the collector of the other transistor. The same energy source preferably serves as a current source for supplying the Hall cell and for biasing the transistors. So again a compact assembly is obtained with the advantages of the integrated circuits involved.

According to another embodiment of the invention, an amplifier and a bistable trigger are also integrated in the same monocrystalline semiconductor plate in addition to a Hall cell; the output of the said differential amplifier connected to the collectors of the transistors is connected to the input of the said trigger stage, or the amplifier is present near the output of the trigger stage. Thus a complete and compact assembly is obtained which forms a bistable switch and which can be manufactured with the usual integrated circuit technologies.

In a specific embodiment of a device according to the invention the emitters of the two transistors have surfaces with the same width and with different length, in which the longitudinal direction should be considered extending parallel to the contacts.

As a result of this it is possible that, in particular when the width is small, the ratios between the surfaces of the emitters and the circumferences of the emitters advantageously are substantially equal to each other.

The transistors of the differential amplifier can be manufactured according to the usual methods, inter alia by diffusion; in that case the emitters of the two transistors are diffused down to the same depth in the same base regions at equal distances to the base contact.

The invention may be used for the manufacture of circuit arrangements using the Hall effect. The invention may be used in particular for the manufacture of miniaturized integrated devices in a monolithic semiconductor plate and be destined for a manually operated member such as a contactless push-button. Push-buttons of a keyboard which operate logic levels of electronic computers can advantageously be manufactured according to the invention.

The invention may be used in all those cases in which a Hall element is succeeded by a stage having a differential structure with at least two transistors the base zones of which are coupled to the output of the Hall element.

The invention will be described in greater detail with reference to an embodiment and the accompanying diagrammatic drawing, in which FIG. 2 shows a diagram of a device according to the invention comprising a differential amplifier stage.

Figure 1:
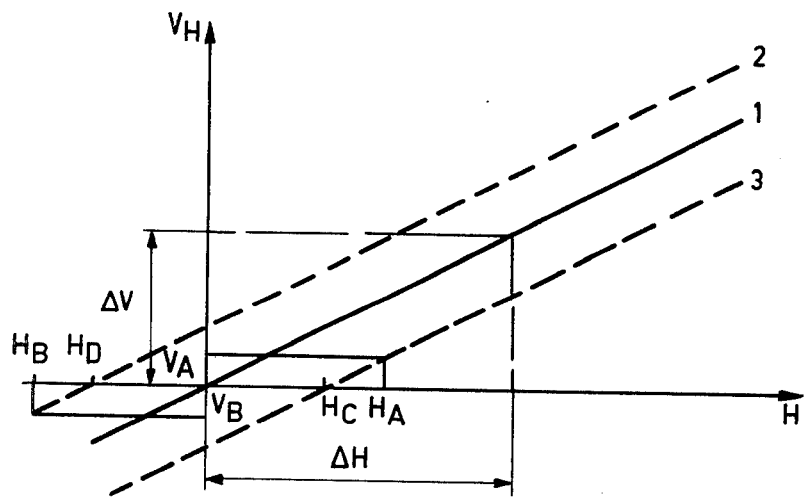
Figure 2:
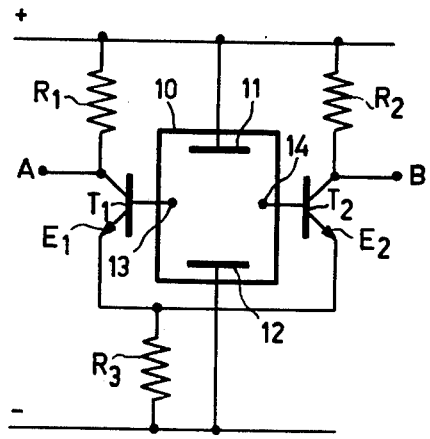

The diagram shown in FIG. 2 relates to a Hall cell through which a current I flows between the contacts 11 and 12 with a voltage of the order of a few volts. In the presence of a magnetic field perpendicular to the plane of the drawing a Hall voltage appears between the contact terminals 13 and 14 which are connected to the bases of the transistors T1 and T2, respectively. These transistors are substantially equal to each other with the exception of their emitter zones E1 and E2 which have different surfaces. The emitter zones are connected to a resistor R3 and the collectors are connected to the resistors R1 and R2, respectively, the assembly being connected between the + and − terminals of a current source.

The output terminals of the device are denoted by A and B and may be connected to a bistable element, for example, a Schmidt trigger.

If the bistable stage which is controlled by the voltage available between A and B flips to the polarity of the input voltage and when said stage must flip according to the presence or absence of a magnetic field, the characteristic $V = f(H)$ of the voltage between A and B as a function of the magnetic field of the field to which the cell 10 is subjected, must be shifted so that the absence of a field corresponds to a voltage having a polarity opposite to the polarity of the voltage which is caused by means of the available magnetic field.

By giving the emitter $E_2$ of the transistor $T_2$ and emitter $E_1$ of the transistor $T_1$ surfaces in a suitable mutual ratio, a shift of the characteristic $V = f(H)$ in the desired direction is caused. For example, the emitter $E_2$ may have a surface which is double of that of the emitter $E_1$: at an absolute temperature in the order of 300° K, at which the coefficient $KT/q$ is equal to 26 mV, the difference between the internal voltage drops of the base emitter junction is approximately 18 mV. Due to this difference, a voltage appears between A and B in the absence of a magnetic field, which voltage has a polarity which is opposite to that of the voltage which is caused in the cell of FIG. 2 by a magnetic field which is normal to the plane of the drawing.

Figure 3:
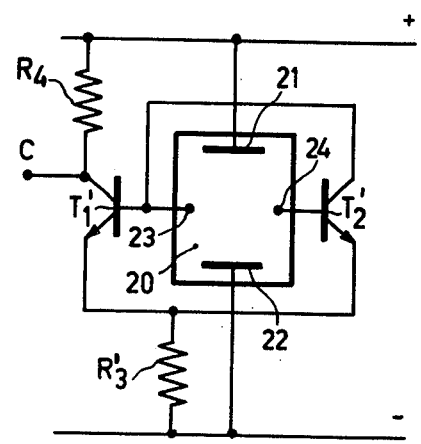
FIG. 3 shows a diagram of a device according to the invention comprising a Schmidt trigger.

The diagram shown in FIG. 3 relates to a Hall device 20 through which a constant current flows between the contacts 21 and 22. In the presence of a magnetic field normal to the plane of the drawing, a Hall voltage appears between the terminals 23 and 24 which are connected to the bases of the transistors T′1 and T′2, respectively. These transistors are the same not counting their emitter zones E′1 and E′2 the surfaces of which are different and show a certain mutual ratio differing from one. The emitter zones E′1 and E′2 are connected to a resistor R′3. The collector of T′1 is connected to a resistor $R_4$ and the base of T′1 is coupled to the collector of T′2. The assembly is arranged between the + and − terminals of a voltage source. The output signal is derived from point C and can be supplied to an amplifier. The current-voltage characteristic $I = f(V)$ of the arrangement at the output of the Hall cell may show, with suitable resistance values, a region having a negative resistance which causes the flipping effect. The ratio between the surfaces of the emitter zones E′1 and E′2 is chosen to be so that said region of negative resistance is present between the voltage values corresponding to the two possible values of the magnetic field in which one of the values may be zero.

Figure 4:
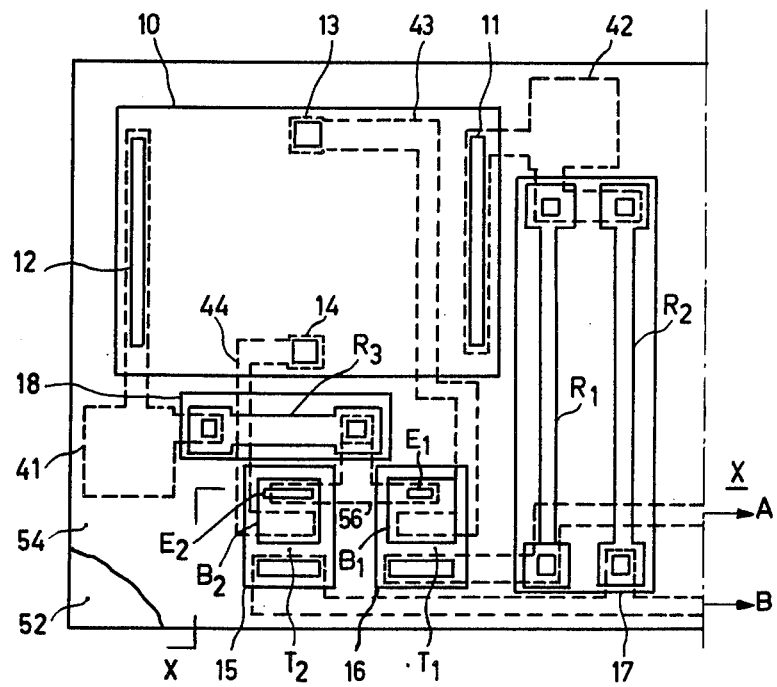
FIG. 4 is a partial plan view of a circuit arrangement having at least one Hall element, two transistors and resistors of a differential amplifier.
Figure 5:
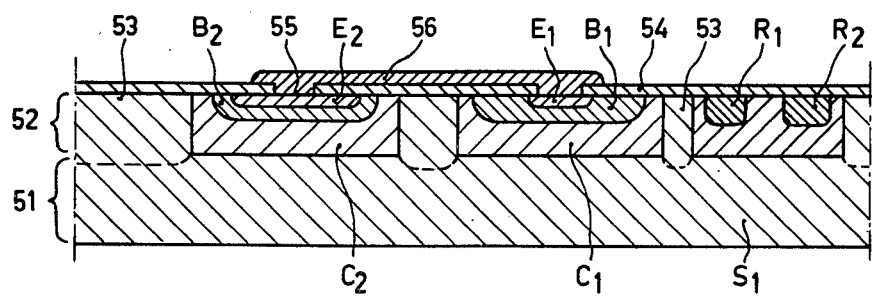
FIG. 5 is a partial sectional view taken on the line XX of the part of the switch shown in the plan view of FIG. 4.

A semiconductor device the diagram of which corresponds to that of FIG. 2 is shown in the plan view of FIG. 4 and partly in FIG. 5 in a cross-sectional view taken on the line X—X in FIG. 4.

The device is manufactured according to the usual integrated circuit technology, in which the starting material is a plate 51 of p-type silicon which serves as a substrate and on which an epitaxial layer 62 of the n-type is deposited. In said layer 52 are diffused insulation zones 52 of the p+ type which in the layer 52 form n-type islands, the island 10 forming the Hall body of a Hall element; other islands 15, 16 serve to form transistors $T_1$ and $T_2$ and the islands 17, 18 for the resistors $R_1$, $R_2$ and $R_3$. The contacts 11 and 12 which are formed by local n+ diffusions are connected to the contact pads 41 and 42. The contacts 13 and 14 which are also formed by local n+ diffusions form the contact terminals from which the Hall voltage is derived and are connected to the bases $B_1$ and $B_2$ of the transistors $T_1$ and $T_2$. Said transistors $T_1$ and $T_2$ are equal not counting the length of their emitters $E_1$ and $E_2$. As shown in the sectional view of FIG. 5 the emitter $E_2$ has a length which is considerably larger than that of the emitter $E_1$.

The connections shown in broken line in FIG. 4, such as 43, 44, 56, can be obtained by deposition of aluminum in a vacuum.

The windows 55 for contacting the emitters may be the same in both transistors. The connection 56 which is deposited on the insulating layer 54 and which connects the two emitters to the resistor $R_3$ thus maintains its symmetry.

What is claimed is:

1. In an integrated semiconductor device of the type having
    a Hall element responsive to a magnetic field for producing between two Hall electrodes of the Hall element a Hall voltage having two different values corresponding to two different states of the magnetic field and
    a differential switching unit responsive to the Hall voltage and having two different stable states, an improved prebiasing means for aligning the switching region of the differential switching unit with the range of Hall voltage values so that the two different stable states of the differential switching unit correspond to the two different states of the magnetic field, the improved prebiasing means comprising an improved input differential stage for the differential switching unit, which comprises:

two transistors each having a base zone of the same conductivity type and an emitter zone forming a base-emitter junction therewith, said emitter zones being held at the same voltage potential with respect to each other, said base zones being electrically connected to said Hall electrodes, and said base-emitter junctions in said integrated semiconductor device formed with unequal areas so as to effect said prebiasing of the switching unit.

2. The improvement defined in claim 1 wherein said two transistors each further comprise a collector zone and said differential switching unit further comprises a trigger circuit electrically connected to said collector zones.

3. The improvement as defined in claim 1 wherein said two transistors are further electrically together as a Schmidt trigger.

4. The improvement as defined in claim 3 wherein said differential switching unit further comprises an amplifier stage response to said Schmidt trigger.

* * * * *